(12) United States Patent
Zhao (10) Patent No.: US 10,582,613 B2
(45) Date of Patent: Mar. 3, 2020

(54) PRINTED CIRCUIT BOARD AND MOBILE DEVICE

(71) Applicant: Hisense Mobile Communications Technology Co., Ltd., Qingdao (CN)

(72) Inventor: Qingyi Zhao, Qingdao (CN)

(73) Assignee: Hisense Mobile Communications Technology Co., Ltd, Qingdao (CN)

( * ) Notice: Subject to any disclaimer, the term of this patent is extended or adjusted under 35 U.S.C. 154(b) by 0 days.

(21) Appl. No.: 16/155,249

(22) Filed: Oct. 9, 2018

(65) Prior Publication Data

US 2019/0045628 A1 Feb. 7, 2019

Related U.S. Application Data

(63) Continuation of application No. PCT/CN2018/106511, filed on Sep. 19, 2018.

(30) Foreign Application Priority Data

Apr. 2, 2018 (CN) .......................... 2018 1 0283622

(51) Int. Cl.
*H05K 7/00* (2006.01)
*H05K 1/02* (2006.01)
*H05K 1/11* (2006.01)

(52) U.S. Cl.
CPC ......... *H05K 1/0298* (2013.01); *H05K 1/0206* (2013.01); *H05K 1/0224* (2013.01); (Continued)

(58) Field of Classification Search
CPC .. H05K 1/0206; H05K 1/0224; H05K 1/0243; H05K 1/0298; H05K 1/111; H05K 1/115
See application file for complete search history.

(56) References Cited

U.S. PATENT DOCUMENTS 7,116,557 B1 * 10/2006 Raby ...................... H05K 1/021
361/720
7,308,182 B2 * 12/2007 McCaig .............. H01S 3/06754
359/333

(Continued)

FOREIGN PATENT DOCUMENTS

CN 1918758 A 2/2007
CN 104302097 A 1/2015

(Continued)

OTHER PUBLICATIONS

Office Action from Chinese Application No. 201810283622.8 dated Mar. 5, 2019 (6 pages).

(Continued)

*Primary Examiner* — Yuriy Semenenko (74) *Attorney, Agent, or Firm* — Harness, Dickey & Pierce, P.L.C.

(57) ABSTRACT

A printed circuit board includes: a board body including one or more wiring layers; a control chip and a target electronic component arranged on one of the one or more the wiring layers on a surface of the board body; a target wiring layer where the target electronic component is placed including a copper absent area around the target electronic component, and a ground backflow connection arranged around the target electronic component to electrically connect a copper area which is formed by the copper absent area with a primary copper area on the target wiring layer.

16 Claims, 4 Drawing Sheets

(52) U.S. Cl.
CPC .............. *H05K 1/111* (2013.01); *H05K 1/115* (2013.01); *H05K 1/0243* (2013.01)

(56) References Cited

U.S. PATENT DOCUMENTS

2006/0044765 A1* 3/2006 Chen .................... H05K 1/0206
361/720
2017/0358847 A1* 12/2017 Cho ....................... H01Q 1/243

FOREIGN PATENT DOCUMENTS

| CN | 206024246 | * | 3/2017 |
| CN | 206024246 | U | 3/2017 |
| CN | 106793458 | A | 5/2017 |

OTHER PUBLICATIONS

Office Action from Chinese Application No. 201810283622.8 dated Aug. 9, 2019 (5 pages).

* cited by examiner

PRINTED CIRCUIT BOARD AND MOBILE DEVICE

This application is a continuation of International Application No. PCT/CN2018/106511, filed Sep. 19, 2018, which claims the benefit and priority of Chinese Patent Application No. 201810283622.8, filed Apr. 2, 2018. The entire disclosures of the above applications are incorporated herein by reference.

FIELD

This disclosure relates to mobile devices, including a printed circuit board in a mobile device.

BACKGROUND

This section provides background information related to the present disclosure which is not necessarily prior art.

A Printed Circuit Board (PCB) provides electrical connections between electronic components, and the electronic components can be electrically connected through metal wiring to transmit signals and communicate with each other. PCB circuits are classified into various categories, such as a single-layer PCB, a dual-layer PCB, a multi-layer PCB, etc., based on the wiring layers provided on the broad.

SUMMARY

This section provides a general summary of the disclosure, and is not a comprehensive disclosure of its full scope or all of its features.

Example embodiments of this disclosure may provide a printed circuit board and a mobile device to address the problem of local high temperature in a thickness-limited space of the mobile device.

Some embodiments of this disclosure provide a printed circuit board. The printed circuit board includes: a board body including one or more wiring layers and at least one surface; a control chip; and a target electronic component, the control chip and the target electronic component positioned on the same one or different ones of the one or more wiring layers, on the same surface or different surfaces of the board body; wherein the wiring layer where the target electronic component is positioned is a target wiring layer including a primary copper area and a target copper area corresponding to the target electronic component, the primary copper area is at least partially separated from the target copper area by a copper absent area defined around at least a portion of the target electronic component, and the target wiring layer includes at least one ground backflow connection arranged to electrically connect the target copper area with the primary copper area on the target wiring layer.

Some embodiments of this disclosure provide a mobile device. The mobile device includes a mobile device body; and a printed circuit board, wherein the printed circuit board includes: a board body including one or more wiring layers and at least one surface; a control chip; and a target electronic component, the control chip and the target electronic component positioned on the same or different ones of the one or more wiring layers, on the same or different surfaces of the board body; wherein the wiring layer where the target electronic component is positioned is a target wiring layer including a primary copper area and a target copper area corresponding to the target electronic component, the primary copper area is at least partially separated from the target copper area by a copper absent area defined around at least a portion of the target electronic component, and the target wiring layer includes at least one ground backflow connection arranged to electrically connect the target copper area with the primary copper area on the target wiring layer.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure

DRAWINGS

The drawings described herein are for illustrative purposes only of selected embodiments and not all possible implementations, and are not intended to limit the scope of the present disclosure.

In order to make technical solutions according to example embodiments of this disclosure more apparent, the drawings to which reference is to be made in the description of the embodiments will be introduced below in brief. In the drawings.

Corresponding reference numerals indicate corresponding parts or features throughout the several views of the drawings.

DETAILED DESCRIPTION

Example embodiments will now be described more fully with reference to the accompanying drawings.

In order to enable those skilled in the art to better understand technical schemes according to this disclosure, technical solutions according to example embodiments of the disclosure will be described below clearly and fully with reference to the drawings in the example embodiments of this disclosure, and the scope of the disclosure is not limited to the embodiments described below.

Figure 1:
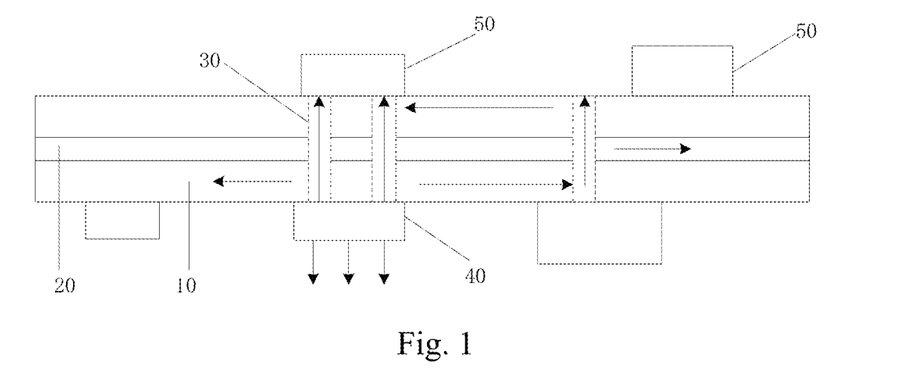
FIG. 1 shows a schematic structural diagram of an example dual-layer PCB.

Taking a dual-layer PCB as an example, FIG. 1 illustrates a schematic structural diagram of a dual-layer PCB. As shown in FIG. 1, the dual-layer PCB includes two wiring layers 10, where the two wiring layers 10 are bonded together through an isolation layer 20. The wiring layers 10 may be copper layers for signal transmission between chips.

At least one via hole 30, which may be coated with a metal layer, can be arranged between the two wiring layers 10, and the via hole 30 can enable metal wires at the different wiring layers 10 to communicate with each other. A control chip 40 is a component on the PCB that generates heat on the PCB, and heat generated by the control chip 40 is dissipated outward through the wiring layer 10 where the control chip 40 is located and the via hole 30, thus resulting in a significant temperature increase of another functional module 50 proximate to the control module 40. In view of this, a heat-dissipating film is typically laid between the surface of the PCB and each electronic component to alleviate a heat load on the other electronic components.

As mobile devices are becoming more and more lightweight, thinner, and multi-functional, given a thickness-limited space, it is difficult to accommodate both the functional module 50 and the heat-dissipating film locally. For example, for an ultra-thin mobile phone which provides a fingerprint module on the backside of the mobile phone, in order to satisfy thickness requirements of the ultra-thin mobile phone, it may be difficult to arrange a heat-dissipating film at the fingerprint module. In such a scenario, the local temperature of the fingerprint module is increased due to influence of the control chip 40, leading to a negative touch experience for the fingerprint module.

In some PCBs, a heat conduction path is formed among the control chip 40, the wiring layer 10, and a target electronic component 51. For a mobile device with limited thickness, the local temperature of the target electronic component 51 tends to be high due to influence of the control chip 40. This problem can also be alleviated by enhancing heat dissipation at the control chip 40, but the expense for dissipation enhancement on the control chip is quite high. Example embodiments of the disclosure provide a printed circuit board and a mobile device. Specifically, copper applied on a target wiring layer 11 where the target electronic component 51 is placed is removed away around the target electronic component 51 to form an unclosed copper absent area 60 and a ground backflow connection 61, so that the heat conduction path between the control chip 40 and the target electronic component 51 is at least partially cut off to block most heat from being conducted from the control chip 40 to the target electronic component 51, without affecting normal wiring of the target electronic component. In this manner, local temperature of the target electronic component 51 can be lowered effectively even if no heat-dissipating film is arranged at the target electronic component 51. The printed circuit board according to this embodiment is simple in structure, costs less, and effectively addresses the problem of high local temperature of the target electronic component 51 without occupying additional heat dissipation space.

Figure 2:
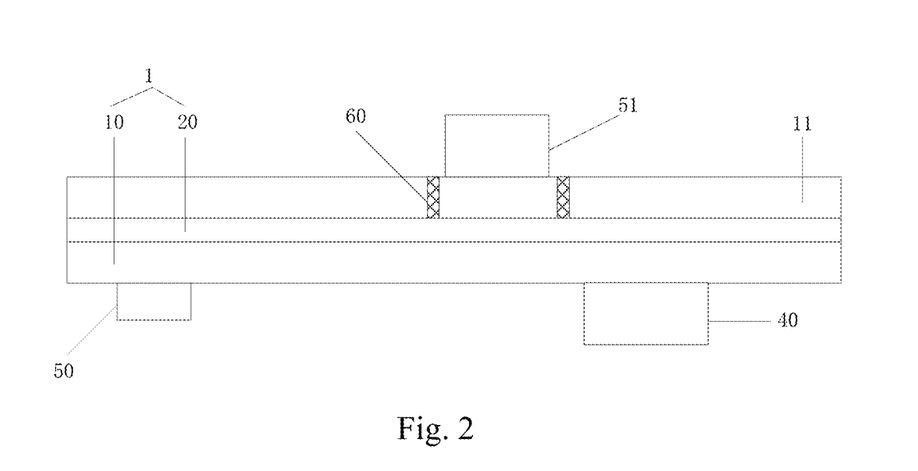
FIG. 2 shows a schematic side view of a printed circuit board according to an embodiment of the disclosure.
Figure 3:
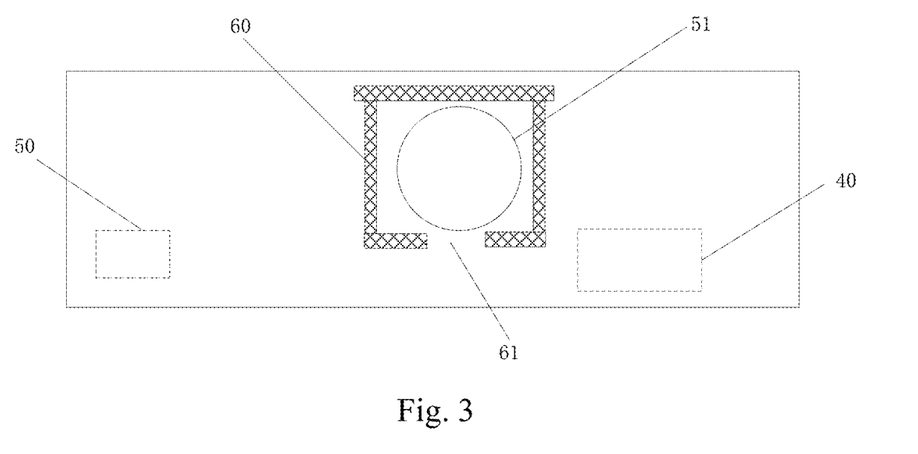
FIG. 3 shows a schematic top view of the printed circuit board of FIG. 2.

FIG. 2 and FIG. 3 illustrate a side view and a top view of a printed circuit board according to an example embodiment of the disclosure. As can be seen from FIG. 2 and FIG. 3, the printed circuit board includes a board body 1, and the board body includes at least one wiring layer 10. In some embodiments of the disclosure, the board body 1 is a single-sided board, a dual-sided board, a multi-sided board including a four-sided board, a six-sided board, etc. When the board body 1 is a single-sided board, a control chip 40 and functional modules for a mobile device may be placed on one surface of the wiring layer 10, and wires of the control chip 40 and the functional modules can be arranged on the other surface of the wiring layer 10. When the board body 1 is a dual-sided board or a multi-sided board, an isolation layer 20 may be further provided between two adjacent wiring layers 10, where the wiring layers 10 are typically copper layers to transmit signals between chips, and the isolation layer 20 is typically made of insulating material to block two adjacent wiring layers 10 from being electrically connected with each other. The control chip 40 and the functional modules are provided on the wiring layers 10 positioned in upper and lower surface layers of the board body 1, a functional module 50 close to the control chip 40 in the horizontal or vertical direction is regarded as a target electronic component 51 for which thermal improvement may be desired due to local high temperatures, and a wiring layer 10 holding the target electronic component 51 is a target wiring layer 11. In some embodiments, the target electronic component 51 is a fingerprint module arranged on the backside of a mobile device. Alternatively, or additionally, the target electronic component 51 may include an image acquiring module, a Home button, an earphone module, a system clock module, or other component or functional module which can perform a specific function. In some embodiments, the control chip 40 includes but is not limited to a CPU, a power source manager, a power amplifier, or other heat producing components or modules.

In some embodiments, the target wiring layer 11 includes a copper absent area 60, wherein the copper absent area 60 may be formed by removing the copper coated on the target wiring layer 11 around the target electronic component 51 so there is no copper conductor in the copper absent area 60 of the target wiring layer 11, so at least some of the heat conducted out by the control chip 40 can be blocked. In some embodiments, the width of the copper absent area 60 ranges from 0.75 mm to 1 mm. The width of the copper absent area 60 may be determined based on the process precision of the PCB, so when the process precision of the PCB is improved, the width of the copper absent area 60 can be set to less than 0.75 mm. But it may not advisable to make the width of the copper absent area 60 extremely tiny, because a tiny width may not be suitable for blocking heat. Because both a ground backflow path of the upper surface of the target wiring layer 11 and wire for signal transmitting in a second wiring layer can avoid the copper absent area 60, the width of the copper absent area 60 may not be designed to be too large; otherwise, there may be more interference to another component due to the extended ground backflow path on the surface, and it may be more difficult to design the wires for signal transmitting.

In some embodiments, the target electronic component 51 is provided on the surface of the PCB, in physical contact with the PCB or spaced from the PCB by some gap. When the target electronic component 51 is in physical contact with the PCB, the copper absent area 60 may be an area formed by removing copper at their contact interface. In some embodiments of the disclosure, the area of the target electronic component 51 in contact with the PCB is equal to the area of the target electronic component 51, and in some other embodiments, the area of the target electronic component 51 in contact with the PCB is less than the area of the target electronic component 51. When there is some gap between the target electronic component 51 and the PCB, the copper absent area 60 may be an area formed by removing copper on the edge of a projection area of the target electronic component 51 onto the target wiring layer 11. Furthermore a ground backflow connection 61 is arranged around the target electronic component to electrically connect a copper area surrounded by the copper absent area with a primary copper area on a target wiring layer, so that the ground backflow path of the target electronic component 51 may not be completely blocked after copper around the target electronic component 51 is removed. Blockage of the ground backflow path of the target electronic component 51 can disable normal communication between the target electronic component 51 and the other functional modules or the control chip 40.

In some embodiments, the copper of the target wiring layer 11, where the target electronic component 51 is placed, is removed around at least a portion of the target electronic component 51 to form the copper absent area 60 with the ground backflow connection 61, so that the heat conduction path between the control chip 40 and the target electronic component 51 is at least partially cut off to thereby block most heat from being conducted from the control chip 40 to the target electronic component 51, without affecting normal wiring of the target electronic component 51. In this way, a local temperature of the target electronic component 51 is lowered effectively even if no heat-dissipating film is arranged at the target electronic component 51. The PCB according to these embodiments is simple in structure, costs less, and effectively addresses the problem of high local temperature of the target electronic component 51 without occupying any additional heat dissipation space.

When the control chip 40 fully overlaps with the target electronic component 51 in the vertical direction, most heat generated by the control chip 40 may be conducted to the surface of the target electronic component 51 through the board body 1, thus making it more difficult to dissipate heat from the target electronic component 51. In order to further improve local heat dissipation of the target electronic component 51, the control chip 40 does not fully overlap with the target electronic component 51 in the vertical direction in some embodiments. Specifically when the control chip 40 and the target electronic component 51 are placed respectively on the upper and lower surface layers of the board body 1, a projection of the control chip 40 along the direction perpendicular to the board body 1 and a projection of the target electronic component 51 along the direction perpendicular to the board body 1 may not fully overlap with each other. The projection of the control chip 40 along the direction perpendicular to the board body 1 does not overlap with the projection of the target electronic component 51 along the direction perpendicular to the board body 1 in some embodiments, so that heat generated by the control chip 40 can be dissipated, and heat conducted to the target electronic component 51 can be greatly reduced.

In some embodiments, the overlapping proportion of the control chip 40 to the target electronic component 51 is determined based on the layout complexity of the PCB. When the layout of the PCB is so complex that the control chip 40 and the target electronic component 51 cannot well avoid each other, thermally conductive adhesive can be filled between the control chip 40 and the wiring layer 10 where the control chip 40 is placed. The thermally conductive adhesive may be bottom filling adhesive with an enhanced thermal conductivity to facilitate conduction of heat from the control chip 40 to its surroundings to thereby alleviate a heat dissipation burden on the target electronic component 51. Furthermore, the thermally conductive adhesive can also improve the adhesion of the control chip 40 to the PCB, and thus improve the reliability of the control chip 40.

In some printed circuit boards, wires for signal transmitting 12 are arranged in the wring layer 10 to transmit signals between different functional modules. In some embodiments, after copper on the surface of the target wiring layer 11 is removed away, signals transmitted at the second wiring layer (not illustrated in FIG. 3) adjacent to the target wiring layer 11 are easily affected by an interference source due to the degraded quality of ground shielding, so that the quality of the transmitted signal may be degraded. In some example embodiments of the disclosure, the target electronic component 51 is a fingerprint module, and the control chip 40 is a CPU, for example, where the bottom of the fingerprint module comes into full contact with the surface of the target wiring layer 11.

Figure 4:
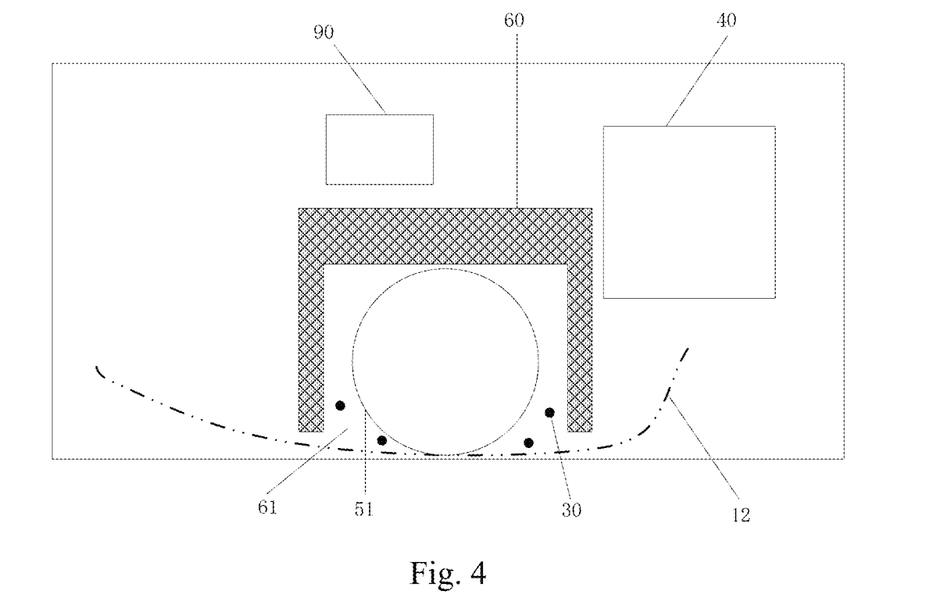
FIG. 4 shows a schematic top view of a printed circuit board according to another embodiment of the disclosure.

FIG. 4 illustrates a top view of a second printed circuit board according to another embodiment of the disclosure. As can be seen from FIG. 4, the fingerprint module may be round, and copper of the target wiring layer 11 is removed away around the target electronic component 51 using a "∏"-shaped tool to form the copper absent area 60. In this way, most area of the fingerprint module is isolated from the target wiring layer 11, and only a short segment of the copper connection is reserved on the lower edge to form the ground backflow connection 61 for electrically connecting the copper area surrounded by the copper absent area with the primary copper area on the target wiring layer, so that the heat conduction from the CPU is reduced effectively, while avoiding completely blocking the ground backflow path on the surface layer of the fingerprint module.

In order to avoid affecting the wires for signal transmitting 12 at a second wiring layer by another interference source due to the degraded effect of ground shielding, in some embodiments the wires for signal transmitting 12 at the second wiring layer can avoid the copper absent area 60, that is, there may be no overlapping area between the wires for signal transmitting 12 and the copper absent area 60 in the projection direction perpendicular to the board body 1, and the wires for signal transmitting at the second wiring layer can be designed such that they bypass the copper absent area 60 to thereby alleviate an adverse influence of the degraded effect of ground shielding.

Furthermore, a via hole 30 may be arranged on the PCB to connect the target wiring layer 11 with the second wiring layer. Because the inner surface of the via hole 30 is typically coated with a metal layer, a part of heat generated by the CPU may also be conducted to the fingerprint module through the via hole 30, and accordingly in some embodiments, the via hole 30 is arranged between the copper absent area 60 and the fingerprint module while bypassing the fingerprint module. Furthermore, a leakage copper ground area 90 of the fingerprint module can be arranged in the primary copper area of the target wiring layer 11. Because the surface of the primary copper area can be integral, the strength of ground backflow on the surface of the fingerprint module may not affected, thus improving the ground reliability thereof.

When the PCB is highly integrated, the wires for signal transmitting 12 are arranged complexly and densely, thus making it difficult to avoid the copper absent area 60, so in another embodiment of the disclosure, an accompanying ground wire 13 is arranged for enhancing ground backflow so that it may not be necessary for the wires for signal transmitting 12 to avoid the copper absent area 60, thus improving the flexibility of wiring in the PCB.

Figure 5:
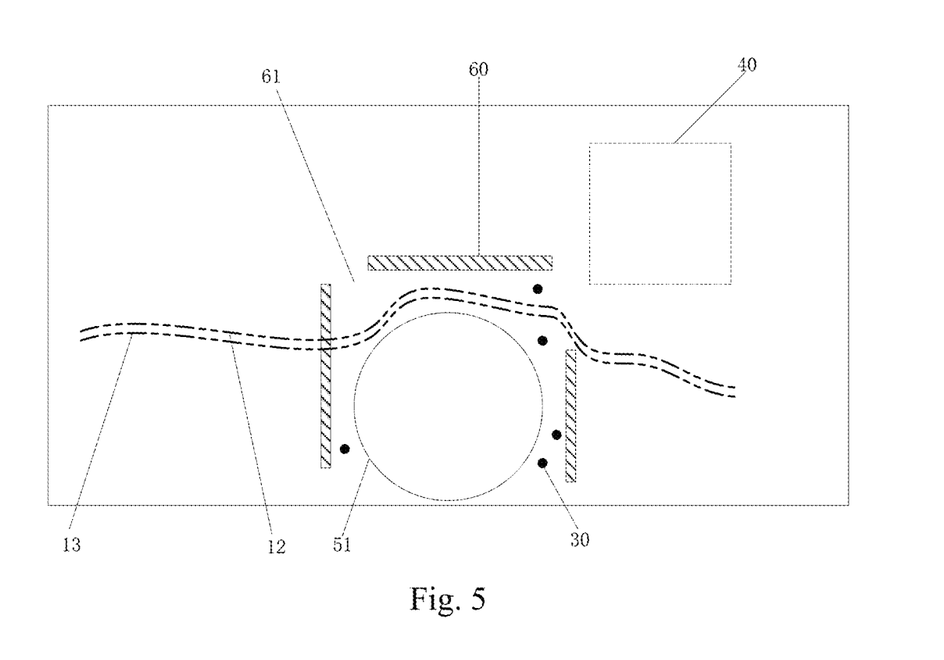
FIG. 5 shows a schematic top view of a printed circuit board according to yet another embodiment of the disclosure.

FIG. 5 illustrates a schematic top view of a printed circuit board according to another embodiment of the disclosure. As can be seen from FIG. 5, copper applied on the target wiring layer 11 is removed away around the target electronic component 51 using a "⊓"-shaped tool to form the copper absent area 60. In this way, most area of the fingerprint module is isolated from the target wiring layer 11 to prevent conduction of heat from the CPU. The ground backflow connection 61 is arranged at a gap between ends of two segmented lines in the "⊓"-shaped copper absent area 60 to thereby inhibit ground backflow of the surface of the fingerprint module from being completely blocked.

In this embodiment, the wires for signal transmitting 12 include an overlapping area with the copper absent area 60 in the projection direction perpendicular to the board body 1 instead of avoiding the copper absent area 60. In order to avoid affecting the wire for signal transmitting 12 at the second wiring layer by another interference source due to a degraded effect of ground shielding, a corresponding accompanying ground wire 13 can be added beside the wire for signal transmitting 12 to thereby enhance ground backflow of the fingerprint module. Furthermore in this embodiment, the via hole 30 may be added between the "⊓"-shaped copper absent area 60 and the round target electronic component 51 as desired for a design.

In the embodiment above, the flexibility and compactness of wiring in the PCB is improved, and there is an additional accompanying ground wire 13, thus further increasing the complexity of wiring in the PCB. In view of this, in another embodiment of the disclosure, the copper is removed in another way to form the copper absent area 60 to thereby improve the flexibility of routing in the PCB without any additional accompanying ground wire 13.

Figure 6:
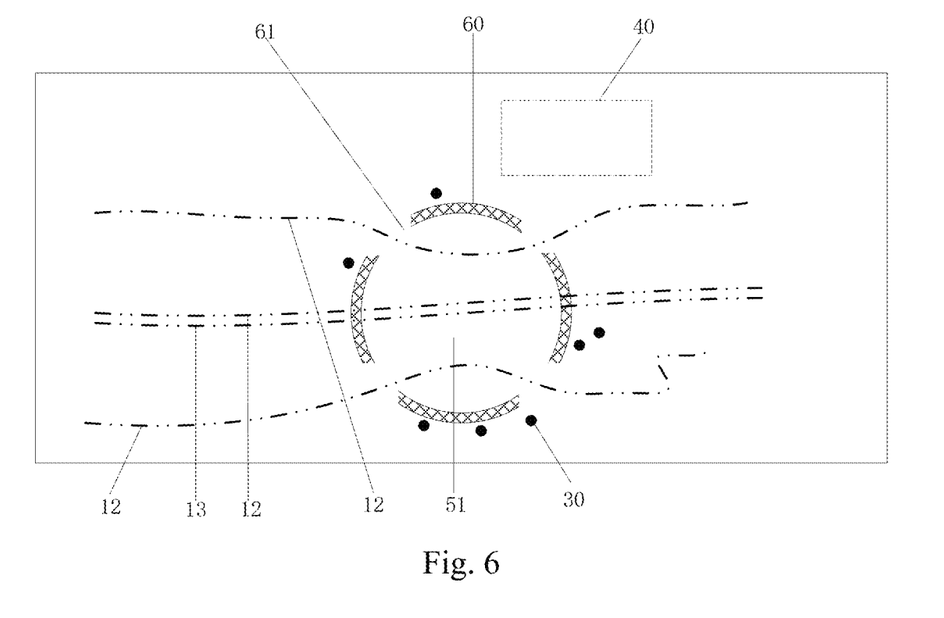
FIG. 6 shows a schematic top view of a fourth printed circuit board according to a further embodiment of the disclosure.

FIG. 6 illustrates a schematic top view of a printed circuit board according to yet another embodiment of the disclosure. As can be seen from FIG. 6, the copper applied on the target wiring layer 11 is removed away around the target electronic component 51 using a ring-shaped tool to form the copper absent area 60. The copper absent area 60 includes a plurality of separate segments of sub-absent areas, a gap is reserved between two adjacent sub-absent areas, and these gaps are ground backflow connections 61 to inhibit ground backflow on the surface layer of the fingerprint module from being completely blocked. In this embodiment, there are four segments of sub-absent areas; in other embodiments, the number of sub-absent areas can be more or less than four.

In this embodiment, there are three wires for signal transmitting 12 at the second wiring layer, where projections of two wires for signal transmitting 12 run through a projection area of the copper absent area through the ground backflow connections 61, and because the wires for signal transmitting 12 do not intersect with the copper absent area 60 in the vertical direction, the wires for signal transmitting 12 are less affected by another interference source. As can be seen, the ground backflow connections 61 are additionally arranged so that the flexibility of wiring in the PCB is improved without any additional accompanying ground wire 13. The projection area of the copper absent area is a projection area of the copper absent area 60 in the projection direction perpendicular to the board body 1; and the projection direction of the wires for signal transmitting 12 is in parallel with the projection direction of the copper absent area 60. An accompanying ground wire 13 is additionally arranged, and the other wire for signal transmitting 12 runs directly through the projection area of the copper absent area, similarly to the embodiment above, so a repeated description thereof will be omitted here. Furthermore, because the copper absent area 60 in this embodiment is arranged in close proximate to the target electronic component 51, corresponding via holes 30 are arranged outside the copper absent area 60 proximate thereto.

In the embodiments above, the shape of the copper absent area 60 is described as being "Π"-shaped, "⊓"-shaped, and ring-shaped by way of an example, but in other embodiments, the copper applied on the surface may be removed away in other suitable shapes without departing from the claimed scope of the disclosure.

Several embodiments take the fingerprint module of a mobile phone with a circular area as an example to describe improvements on heat dissipation.

Figure 7:
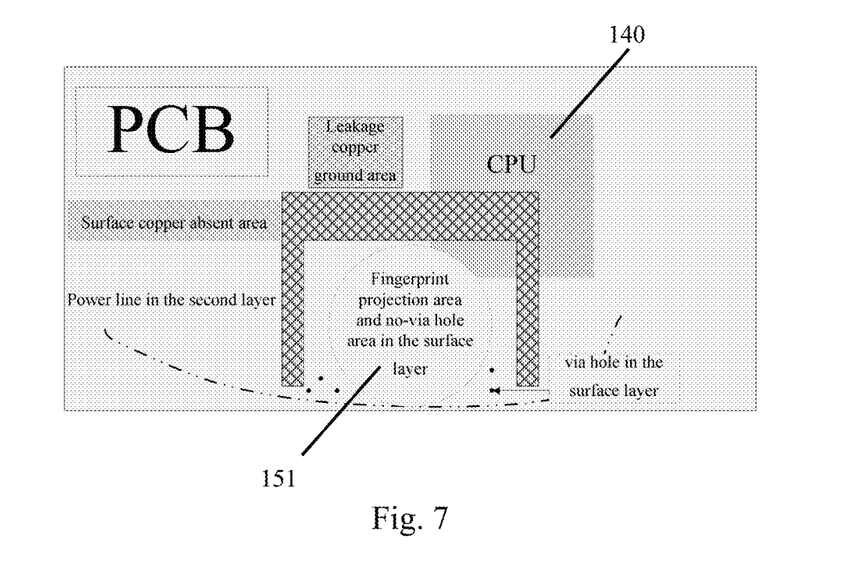
FIG. 7 shows a schematic diagram of a layout of the surface of a PCB according to another embodiment of the disclosure.
Figure 8:
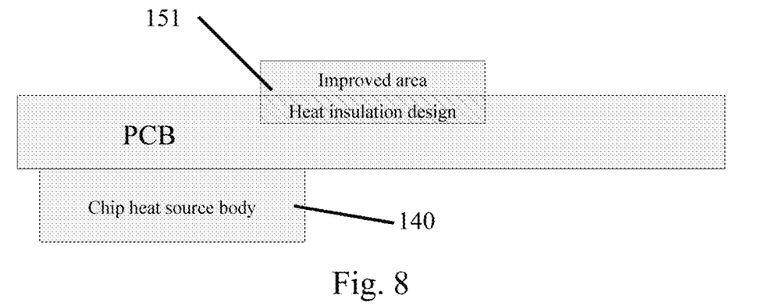
FIG. 8 shows a schematic diagram of the PCB with a chip heat source body and an improved area arranged on both sides thereof according to yet another embodiment of the disclosure.

As illustrated in FIG. 7, the fingerprint module 151 of the mobile phone is circular, so a projection of the fingerprint module on a PCB is also circular. A chip heat source 140 (for example CPU) and the fingerprint module are placed in the thickness direction as illustrated in FIG. 8. The CPU partially overlaps with the fingerprint module, and the copper is removed away around the circular projection of the fingerprint module using a "Π"-shaped tool to thereby isolate most area of the fingerprint module from the surface layer of the PCB while reserving a short segment of the copper connection between the area and the lower edge of the PCB so as to prevent ground backflow on the surface layer of the area of fingerprint module from being completely blocked. No via hole is arranged in the circular projection area, of the fingerprint module, in the surface layer of the PCB, and in order to avoid power lines at an underlying second layer from being affected by an interference source due to poor ground shielding, the entire copper absent area may be avoided. A via hole can be added between the "Π"-shaped absent area and the circular projection on the surface layer of the PCB if desired. A leakage copper ground point of the fingerprint module lies outside the "absent area".

In this embodiment, temperature in the circular area corresponding to the fingerprint module 151 drops, and there is a temperature increase at another position in the PCB according to the law of energy conservation. Projections of the CPU 140 which is a chip heat source, and the area of the fingerprint module partially overlap with each other, so there is a high probability that temperature around the CPU area will rise. Optionally a heat dissipation arrangement is enhanced around the CPU area. Bottom filling adhesive with an enhanced thermal conductivity can be arranged around the CPU to facilitate conduction of heat from the CPU to its surrounding environment, and also improve the adhesion of the CPU to the PCB. The chip heat source can be handled in substantially the same way throughout the following several embodiments, so a repeated description thereof will be omitted here.

Figure 9:
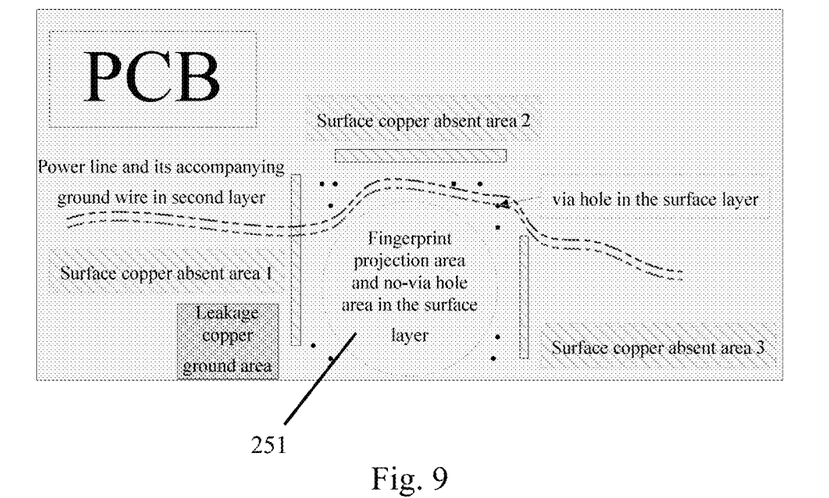
FIG. 9 shows a schematic diagram of another layout of the surface of a PCB according to a further embodiment of the disclosure.

As illustrated in FIG. 9, the fingerprint module 251 of the mobile phone is circular, so a projection of the fingerprint module on a PCB is also circular. The copper is removed away around the circular projection of the fingerprint module using a "⊓"-shaped tool to thereby isolate most area of the fingerprint module from the surface layer of the PCB while reserving a short segment of the copper connection between several segmented lines so as to inhibit ground backflow on the surface layer of the area of fingerprint module from being completely blocked. No via hole is arranged in the circular projection area, of the fingerprint module, in the surface layer of the PCB, and in order to avoid power lines at an underlying second layer from being affected by an interference source due to poor ground shielding, the projection area of the fingerprint module can be avoided. Unlike the above embodiment of FIG. 7, the power lines run through a segment of copper absent area, and in order to avoid the ground backflow path from being subjected to interference due to the removing-away of the copper, optionally an accompanying ground wire is added at the same layer as the power signal layer. A via hole can be added between the "□"-shaped absent area and the circular projection in the surface layer of the PCB as desired.

Figure 10:
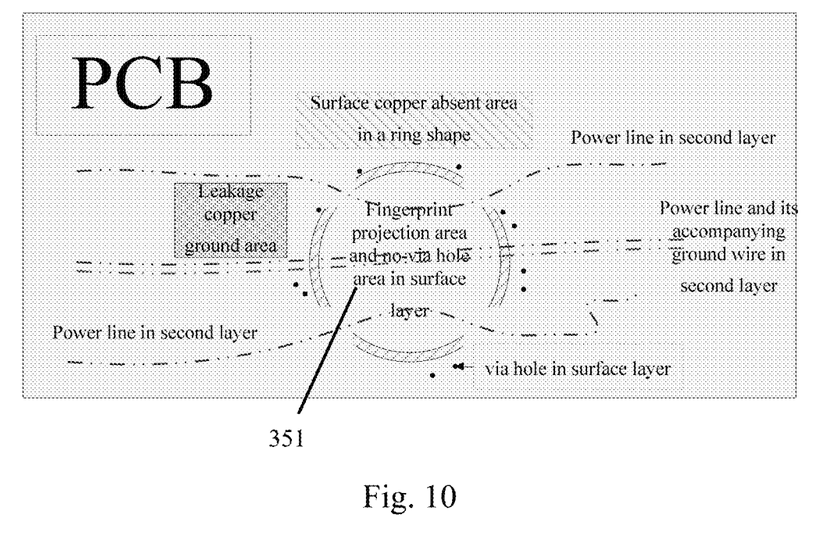
FIG. 10 shows a schematic diagram of a layout of the surface of a PCB according to another embodiment of the disclosure.

As illustrated in FIG. 10, the fingerprint module 351 of the mobile phone is circular, so a projection of the fingerprint module on a PCB is also a circular. The copper is removed away around the circular projection of the fingerprint module using a "ring"-shaped tool to thereby isolate most area of the fingerprint module from the surface layer of the PCB while reserving a short segment of the copper connection between several segmented lines so as to inhibit ground backflow on the surface layer of the area of the fingerprint module from being completely blocked. No via hole is arranged in the circular projection area, of the fingerprint module, in the surface layer of the PCB, and in order to avoid power lines at an underlying second layer from being affected by an interference source due to poor ground shielding, the projection area of the fingerprint module can be obviated. Unlike the and embodiments in FIGS. 7 and 9 above, there are three power lines in total, where two power lines run through between the segmented lines, and one power line runs through a segment of copper absent area, and in order to avoid the ground backflow path from being subjected to interference due to the removing-away of the copper, optionally an accompanying ground wire is added at the same layer as the power signal layer. A via hole can be added outside the ring-shaped absent area in the surface layer of the PCB as desired for a design.

Further to the printed circuit board according to the embodiments above, another example embodiment of the disclosure further provides a mobile device including the printed circuit board according to any one of the embodiments above.

Advantageous effects of the disclosure may include: a printed circuit board and a mobile device, and the printed circuit board includes: a board body including one or more wiring layers; a control chip and a target electronic component arranged on one of the one or more wiring layers on a surface of the board body; a target wiring layer where the target electronic component is placed, applied with copper, including a copper absent area which is formed by removing copper applied around at least a portion of the target electronic component, and a ground backflow connection arranged around at least a portion of the target electronic component to electrically connect a copper area which is formed by the copper absent area with a primary copper area on the target wiring layer. In some embodiments of the disclosure, the copper of the target wiring layer, where the target electronic component is placed, is removed away around at least a portion of the target electronic component to form the unclosed copper absent area where the ground backflow connection is reserved, so that a heat conduction path between the control chip and the target electronic component is at least partially cut off to thereby block most heat from being conducted from the control chip to the target electronic component, without affecting normal wiring of the target electronic component. In this way, local temperature of the target electronic component is lowered even if no heat-dissipating film is arranged at the target electronic component. This solution is simple in structure, costs less, and is able to address the problem of high local temperature of the target electronic component without occupying additional heat dissipation space.

The respective embodiments of the disclosure have been described progressively in the description, reference can be made to each other for the description of their identical or like components, and their differences from each other have been highlighted in their description. The embodiments of the device or the system have been described only by way of an example, where the elements described as separate components may or may not be physically separate, and the components illustrated as elements may or may not be physical elements, that is, they may be co-located, or may be distributed onto a plurality of elements. A part or all of the modules can be selected as needed in reality to implement the solutions according to the embodiments of the disclosure. Those ordinarily skilled in the art can appreciate and implement these embodiments.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A printed circuit board, comprising:
 a board body including one or more wiring layers and at least one surface;
 a control chip; and
 a target electronic component, the control chip and the target electronic component positioned on the same one or different ones of the one or more wiring layers, on the same surface or different surfaces of the board body;
 wherein the wiring layer where the target electronic component is positioned is a target wiring layer including a primary copper area and a target copper area corresponding to the target electronic component, the primary copper area is at least partially separated from the target copper area by a copper absent area defined around at least a portion of the target electronic component, and the target wiring layer includes at least one ground backflow connection arranged to electrically connect the target copper area with the primary copper area on the target wiring layer; and
 wherein the printed circuit board includes one or more via holes connecting the target wiring layer and another one of the wiring layers adjacent to the target wiring layer, the via holes are arranged between the copper absent area and the target electronic component, and projections of the via holes along a direction perpendicular to the board body do not overlap with a projection of the copper absent area and a projection of the target electronic component along the direction perpendicular to the board body.

2. The printed circuit board according to claim 1, wherein a projection of the control chip along the direction perpendicular to the board body does not fully overlap the projection of the target electronic component along the direction perpendicular to the board body.

3. The printed circuit board according to claim 1, wherein a signal transmission wire is positioned within another one of the wiring layers adjacent to the target wiring layer, and a projection of the signal transmission wire along the direction perpendicular to the board body does not overlap with the projection of the copper absent area along the direction perpendicular to the board body.

4. The printed circuit board according to claim 1, wherein a signal transmission wire and an accompanying ground wire corresponding with the signal transmission wire are positioned within another one of the wiring layers adjacent to the target wiring layer, and a projection of the signal transmission wire along the direction perpendicular to the board body overlaps with the projection of the copper absent area along the direction perpendicular to the board body.

5. The printed circuit board according to claim 1, wherein a signal transmission wire is positioned within another one of the wiring layers adjacent to the target wiring layer, a plurality of ground backflow connections including said ground backflow connection extend through the copper absent area, and a projection of the signal transmission wire along the direction perpendicular to the board body extends through the projection of the target copper area along the direction perpendicular to the board body by the ground backflow connections.

6. The printed circuit board according to claim 1, further comprising a thermally conductive adhesive positioned between the control chip and the wiring layer where the control chip is located.

7. The printed circuit board according to claim 1, wherein a ground area of the target electronic component is arranged in the primary copper area.

8. The printed circuit board according to claim 1, wherein a width of the copper absent area is in a range from 0.75 mm to 1 mm.

9. A mobile device, comprising:
a mobile device body; and
a printed circuit board, wherein the printed circuit board comprises:
a board body including one or more wiring layers and at least one surface;
a control chip; and
a target electronic component, the control chip and the target electronic component positioned on the same or different ones of the one or more wiring layers, on the same or different surfaces of the board body;
wherein the wiring layer where the target electronic component is positioned is a target wiring layer including a primary copper area and a target copper area corresponding to the target electronic component, the primary copper area is at least partially separated from the target copper area by a copper absent area defined around at least a portion of the target electronic component, and the target wiring layer includes at least one ground backflow connection arranged to electrically connect the target copper area with the primary copper area on the target wiring layer; and
wherein the printed circuit board includes one or more via holes connecting the target wiring layer and another one of the wiring layers adjacent to the target wiring layer, the via holes are arranged between the copper absent area and the target electronic component, and projections of the via holes along a direction perpendicular to the board body do not overlap with a projection of the copper absent area and a projection of the target electronic component along the direction perpendicular to the board body.

10. The mobile device according to claim 9, wherein a projection of the control chip along the direction perpendicular to the board body does not fully overlap the projection of the target electronic component along the direction perpendicular to the board body.

11. The mobile device according to claim 9, wherein a signal transmission wire is positioned within another one of the wiring layers adjacent to the target wiring layer, and a projection of the signal transmission wire along the direction perpendicular to the board body does not overlap with the projection of the copper absent area along the direction perpendicular to the board body.

12. The mobile device according to claim 9, wherein a signal transmission wire and an accompanying ground wire corresponding with the signal transmission wire are positioned within another one of the wiring layers adjacent to the target wiring layer, and a projection of the signal transmission wire along the direction perpendicular to the board body overlaps with the projection of the copper absent area along the direction perpendicular to the board body.

13. The mobile device according to claim 9, wherein a signal transmission wire is provided within another one of the wiring layers adjacent to the target wiring layer, a plurality of ground backflow connections including said ground backflow connection extend through the copper absent area, and a projection of the signal transmission wire along the direction perpendicular to the board body extends through the projection of the target copper area along the direction perpendicular to the board body by the ground backflow connections.

14. The mobile device according to claim 9, further comprising a thermally conductive adhesive positioned between the control chip and the wiring layer where the control chip is located.

15. The mobile device according to claim 9, wherein a ground area of the target electronic component is arranged in the primary copper area.

16. The mobile device according to claim 9, wherein a width of the copper absent area is in a range from 0.75 mm to 1 mm.

* * * * *